(12) United States Patent
Brox

(10) Patent No.: US 11,508,430 B2
(45) Date of Patent: Nov. 22, 2022

(54) DATA CIRCUIT FOR A LOW SWING DATA BUS

(71) Applicant: Micron Technology, Inc., Boise, ID (US)

(72) Inventor: Martin Brox, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/214,016

(22) Filed: Mar. 26, 2021

(65) Prior Publication Data

US 2022/0310149 A1 Sep. 29, 2022

(51) Int. Cl.
*G06F 13/16* (2006.01)
*G11C 11/4074* (2006.01)
*G06F 13/18* (2006.01)
*G11C 11/408* (2006.01)

(52) U.S. Cl.
CPC ...... *G11C 11/4074* (2013.01); *G06F 13/1673* (2013.01); *G06F 13/18* (2013.01); *G11C 11/4082* (2013.01)

(58) Field of Classification Search
None
See application file for complete search history.

(56) References Cited

U.S. PATENT DOCUMENTS

| 5,600,815 | A | * | 2/1997 | Lin | G11C 7/1036 |
| | | | | | 710/52 |
| 7,834,667 | B1 | * | 11/2010 | Wong | H03K 19/00315 |
| | | | | | 326/26 |
| 8,279,660 | B2 | * | 10/2012 | Perisetty | G11C 11/412 |
| | | | | | 365/156 |
| 10,607,692 | B2 | * | 3/2020 | Kim | G11C 16/08 |
| 2005/0117433 | A1 | * | 6/2005 | Fujisawa | G11C 7/1069 |
| | | | | | 365/226 |
| 2010/0220527 | A1 | * | 9/2010 | Norman | G11C 19/287 |
| | | | | | 365/189.16 |
| 2020/0371873 | A1 | * | 11/2020 | Schaefer | G06F 11/1048 |

* cited by examiner

*Primary Examiner* — Michael Sun
(74) *Attorney, Agent, or Firm* — Holland & Hart LLP

(57) ABSTRACT

Methods, systems, and devices for a data circuit for a low swing data bus are described. An apparatus may include a data bus that may transfer data at a first voltage different than a second voltage that is associated with one or more components of the memory array. A transistor, coupled with the data bus, may receive the second voltage and send a third voltage. A first in first out (FIFO), coupled with the transistor, may receive the third voltage from the transistor. The FIFO circuit may include one or more precharge components that drive an input voltage of the FIFO circuit to the second voltage associated with the one or more components of the memory array based on receiving the third voltage.

20 Claims, 6 Drawing Sheets

DATA CIRCUIT FOR A LOW SWING DATA BUS

FIELD OF TECHNOLOGY

The following relates generally to one or more systems for memory and more specifically to a data circuit for a low swing data bus.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
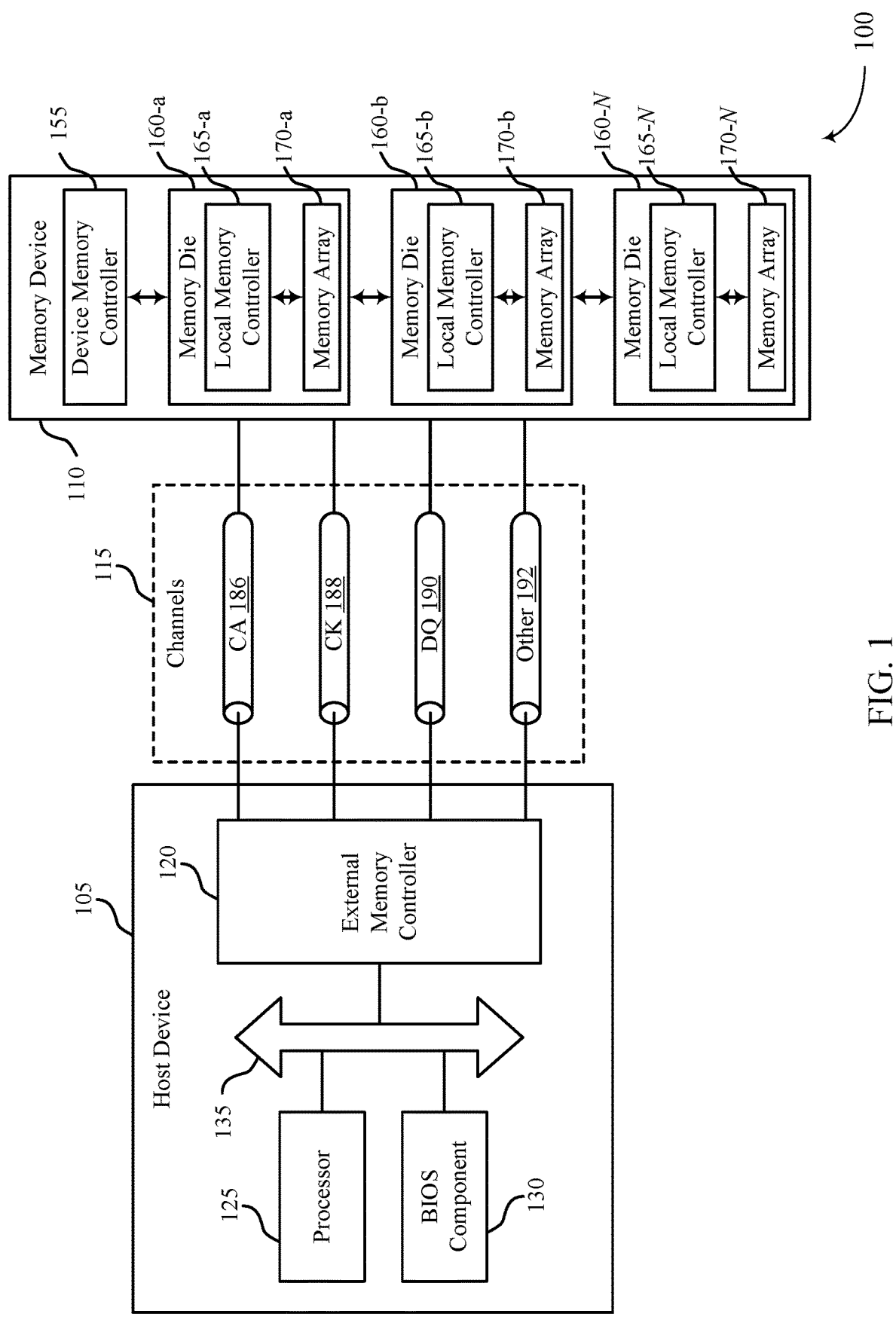
FIG. 1 illustrates an example of a system that supports a data circuit for a low swing data bus in accordance with examples as disclosed herein.

A system may include a memory device and a host device coupled with the memory device. In some examples, the host device may initiate an access operation (e.g., read operation, write operation) at the memory device. In such examples, the memory device may transfer data from a first location to a second location in response to receiving the access operation, and the memory device may transfer the data over a bus. In some examples, the memory device may be a high-frequency bus system (e.g., a graphics system such as a graphic double data rate system). In some cases, the memory device may utilize limited swing signaling when transferring data over the bus to reduce current consumption. That is, the memory device may transfer data at a voltage lower than a voltage (e.g., a full swing or full voltage) associated with one or more components of a memory array in the memory device—e.g., CMOS circuitry or peripheral components that process or perform digital calculations on the data. In such examples, the memory device may have to recover the limited swing on the bus to operate the CMOS circuitry, which may require relatively more power. For example, the memory device may transfer data at the limited swing on the bus from a first location to a data circuit, such as a first in first out (FIFO) circuit. In such examples, the memory device may have to recover to the full swing voltage to process (e.g. perform) digital calculations on the data received at the FIFO. In some examples, it may be difficult to recover the limited swing to the full swing—e.g., in a high-frequency bus system. For example, recovering the limited swing may utilize additional complicated CMOS circuitry and the memory device may consume more power and require more current recovering the limited swing than the memory device conserves by utilizing the limited swing bus—e.g., the additional CMOS circuitry may utilize a relatively high amount of power and current. Improved swing operation for data circuits, such as FIFO circuits, is needed.

As described herein, a memory device may utilize a FIFO circuit with a simple cell input (e.g., an n-type metal-oxide semiconductor transistor) and precharge the FIFO circuit to a full swing voltage before receiving the data. For example, in a high-frequency system (e.g., a graphics system such as a graphics double data rate system) connecting different regions of a chip (e.g., the memory device) over a distance (e.g., a distance on the order of millimeters), the memory device may utilize a FIFO circuit to securely transfer the data. The memory device may also utilize the FIFO circuit to correct for propagation delays due to locally different voltages and respective delays. For example, the FIFO may receive data from a first location with a first voltage and first delay (e.g., time scale or time domain) and receive data from a second location with a second voltage and a second delay and generate an output that corrects the propagation delays. The FIFO circuit may receive the data from a limited swing bus. By utilizing the simple cell input and precharging the FIFO described in the present disclosure, the FIFO circuit may recover the full swing voltage (e.g., the voltage associated with the one or more components of the memory array or VPERI) to process the data. For example, the FIFO circuit may include one or more precharge components. The memory system may utilize a signal to precharge the FIFO circuit to the full swing voltage before the FIFO receives the data—the limited swing may automatically be recovered in the FIFO circuit. In such examples, the memory device may conserve current by using the limited swing bus while also processing the data at the FIFO, among other benefits.

Features of the disclosure are initially described in the context of systems and dies as described with reference to FIGS. 1 and 2. Features of the disclosure are described in the context of a circuit and timing diagram as described with reference to FIGS. 3 and 4. These and other features of the disclosure are further illustrated by and described with reference to an apparatus diagram and flowcharts that relate to a data circuit for a low swing data bus as described with reference to FIGS. 5 and 6.

FIG. 1 illustrates an example of a system 100 that supports a data circuit for a low swing data bus in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 a, memory die 160 b, memory die 160 N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may use a high-frequency bus system (e.g., graphics system such as a graphics double data rate system, a system with a clock period of 500 picoseconds or shorter). In such examples, the memory device 110 may utilize a FIFO to securely transfer data from a first region of the memory device 110 to a second region of the memory device 110—e.g., from memory die 160-a to the FIFO. In some examples, the memory device 110 may also utilize a limited swing bus to transfer the data—e.g., the memory device 110 may use a voltage lower than a voltage (e.g., full swing voltage) associated with other components of the memory device 110 to conserve power and current consumption. In some examples, the memory device 110 may have to recover the limited swing to the full swing to process and perform digital calculations on the data at the FIFO circuit. In some cases, the recovery may be difficult—e.g., adding additional CMOS circuitry to recover the limited swing may consume more power and current.

As described herein, the memory device 110 may utilize a simple cell FIFO circuit with precharge components. For example, the FIFO circuit may include one or more transistors (e.g., an nMOS transistor) as an input and include one or more precharge components. The memory device 110 may precharge the FIFO to the full swing voltage by transmitting a signal to the one or more precharge components. The FIFO may then receive the data and process and store the data—e.g., the limited swing voltage may automatically be recovered to the full swing voltage based on precharging the FIFO circuit with the one or more precharge devices. In such examples, the memory device 110 may reduce the consumption of power and current with the limited swing bus while still being able to process the data at the full swing at the FIFO, among other advantages.

Figure 2:
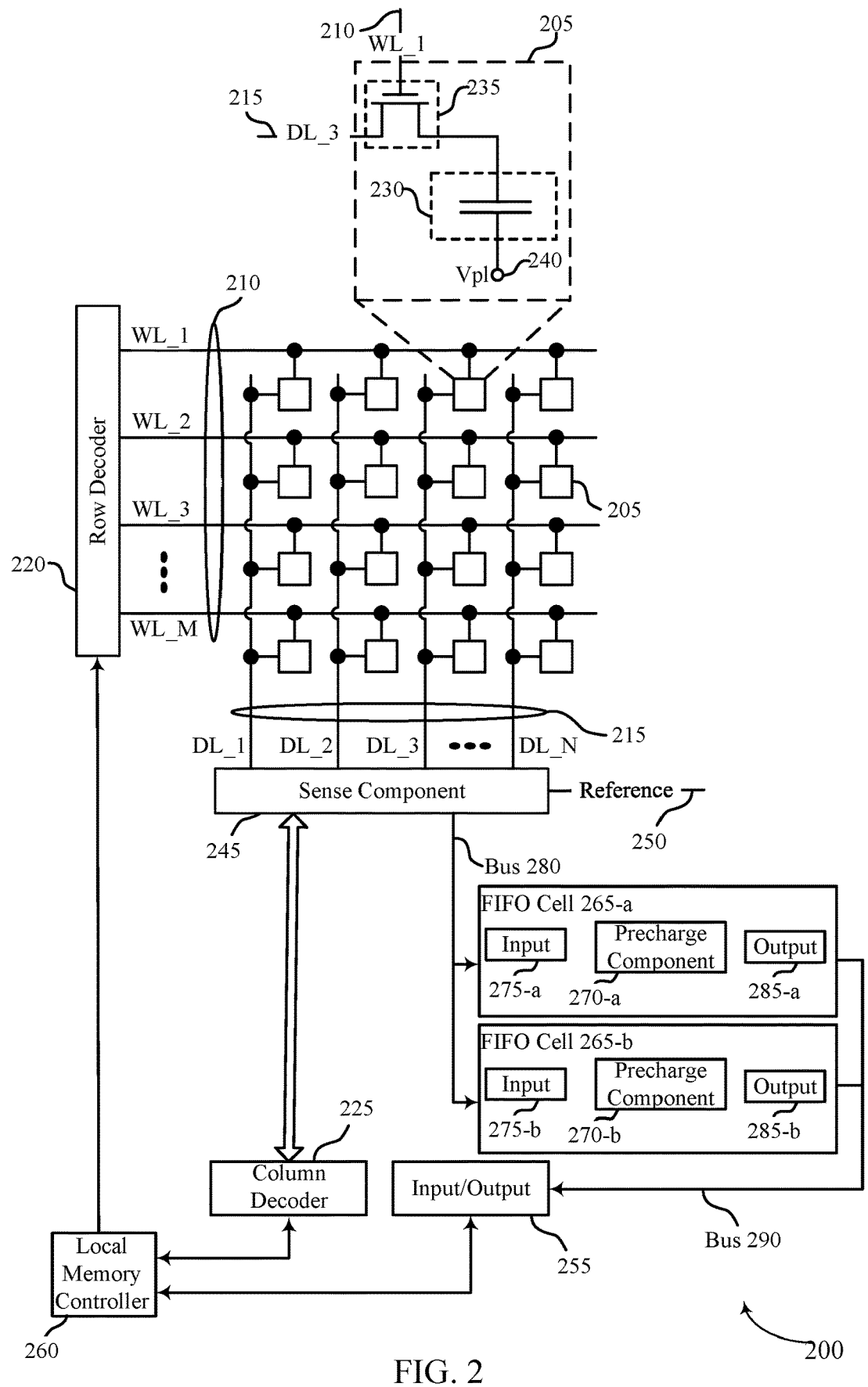
FIG. 2 illustrates an example of a memory die that supports a data circuit for a low swing data bus in accordance with examples as disclosed herein.

FIG. 2 illustrates an example of a memory die 200 that supports a data circuit for a low swing data bus in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

FIFO 265 (e.g., the FIFO cell 265-a and FIFO cell 265-b may be collectively referred to as FIFO 265) may be configured to receive data from the sense component 245. It should be noted two FIFO cells (e.g., the FIFO cell 265-a and FIFO cell 265-b) are shown for illustrative purposes only. That is, the FIFO 265 may include more than two FIFO cells (e.g., three, four, five, six, seven, eight, nine, or more FIFO cells). In some examples, the FIFO 265 may be inside the I/O 255. The FIFO 265 may be configured to receive data from one or more memory cells 205 in the memory array 200. The FIFO 265 may be operable to correct for propagation delays associated with receiving data from different locations. For example, the FIFO 265 may receive data from a first memory cell 205 having a first voltage and a first time delay and data from a second memory cell 205 having a second voltage and a second time delay. The FIFO 265 may be configured to correct for propagation delays associated with receiving the data from the first memory cell and the second memory cell and outputting a stream of data including data from both the first memory and the second memory cell In some examples, an individual FIFO cell (e.g., FIFO cell 265-a) may be selected to receive data based on receiving an input signal. For example, the data bus 280 may transfer the data to the FIFO cell 265-a at a limited swing signaling or voltage—e.g., at a voltage lower than a voltage utilized by the FIFO cell 265-a to process data associated with a logic state '1'-when an input signal is received at FIFO cell 265-a. In some examples, the limited swing voltage may enable the data bus 280 to transfer data at a voltage that is less than a voltage used by components of the memory array 200 to process the data—e.g., a full swing voltage. For example, the components of the memory array 200 components may utilize approximately 1.1. volts to process data associated with a logic state '1.' In the limited swing signaling example, the data bus 280 may transfer the data associated with the logic '1' at approximately 0.5 volts—e.g., at a limited swing voltage less than the full swing voltage. Accordingly, the data bus 280 may transfer data in the memory array 200 at a voltage less than the full swing voltage to conserve current consumption. In such examples, the FIFO cell 265-a may have to recover the limited swing voltage received from the data bus 280 to the full swing voltage utilized by the FIFO cell 265-a to process the data. In some examples, the FIFO 265 may also output data on bus 290 to the input/output 255—e.g., FIFO cell 265-a may be selected based on an output signal received and output data onto bus 290. In some examples, the bus 290 may also be a limited swing bus.

As described herein, the local memory controller 260 may be configured to transmit a signal to a FIFO cell 265-a or FIFO cell 265-b to activate one or more precharge components 270 before the respective FIFO cell 265 receives the data. In such examples, the one or more precharge components 270 may precharge the respective FIFO cell 265 to a full swing voltage (e.g., the voltage utilized by the respective FIFO cell 265 to process data). For example, FIFO cell 265-a may be precharged to the full swing voltage by precharge component 270-a. That is, precharging may refer to precharging one or more FIFO cells 265 to the full voltage before receiving data at an input 275. Additionally, the FIFO 265 may also include an input 275 and output 285. In some examples, the input 275 or the output 285 may be external to the FIFO 265—e.g., the input 275-a or output 285-a may be considered distinct from the FIFO cell 265-a. In some examples, the input 275-a may be an nMOS transistor—e.g., the transistor may pull down the voltage receive and not pull the voltage up. In such examples, the FIFO cell 265-a may receive the data from the sense component 245 at a limited swing from the data bus 280. The transistor input 275-a may prevent voltage and power leaking from the FIFO cell 265-a to the data bus 280. In some examples, the gate of the nMOS transistor may be coupled with the input signal and select the FIFO cell 265-a based on receiving the input signal. Additionally, the FIFO cell 265-a may be operable to process the data at the full swing based on the precharge. If the FIFO cell 265-a determines the data processed is associated with the logic '1', the FIFO cell 265-a may maintain the high swing voltage. If the FIFO cell 265-a determines the data processed is associated with a logic '0', the FIFO cell 265-a may discharge to a ground voltage.

In some examples, FIFO 265 may also be configurable to correct for propagation delays between data received from the first memory cell and data received from the second memory cell and output the data to the local memory controller 260. In some examples, FIFO 265 may be associated with reading data. In other examples, FIFO 265 may be associated with writing data. For example, memory controller 260 may send data to the input/output 255 and through the FIFO 265 to the sense component 245 and memory cells 205.

Figure 3:
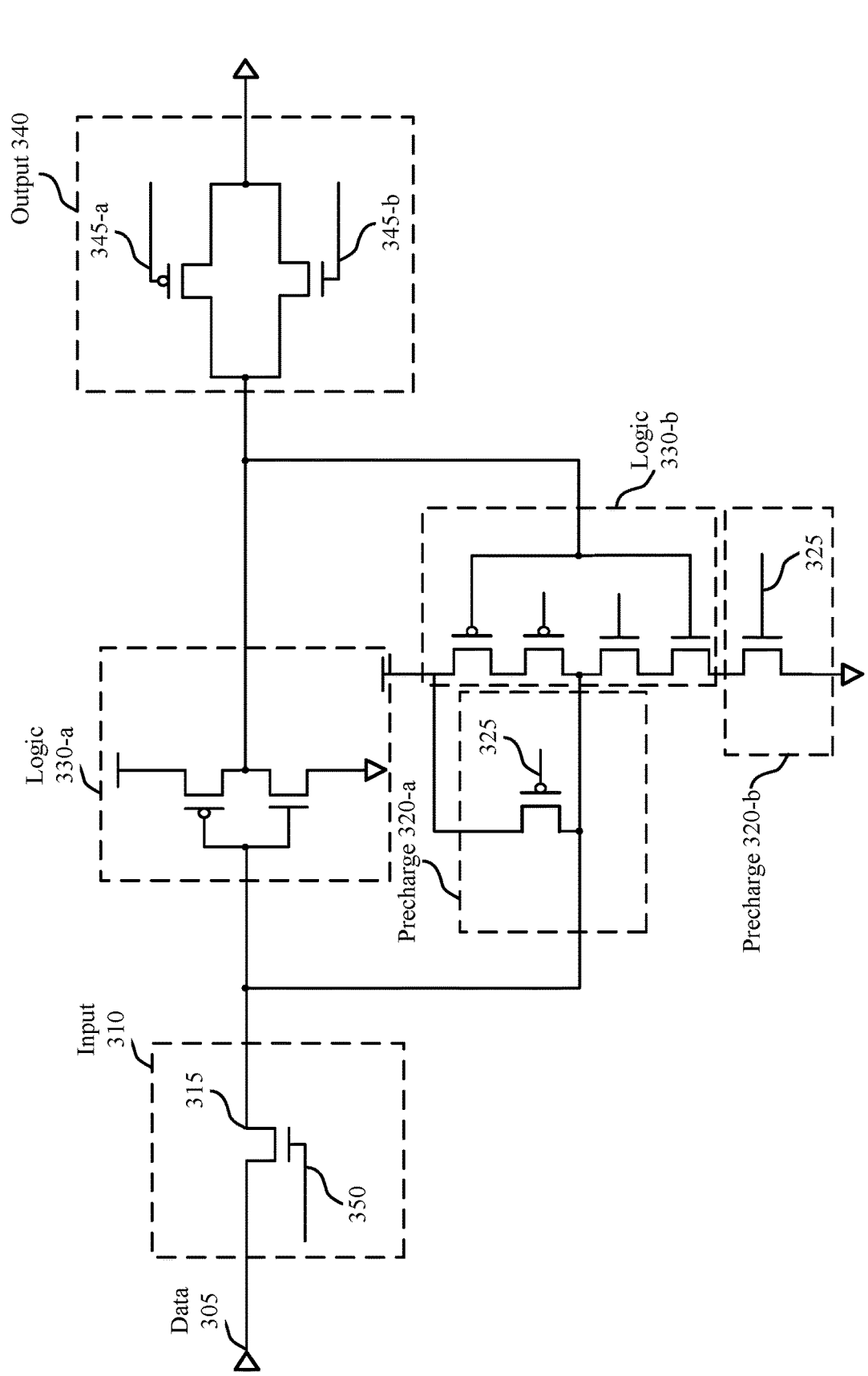
FIG. 3 illustrates an example of circuit that supports a data circuit for a low swing data bus in accordance with examples as disclosed herein.

FIG. 3 illustrates an example of a circuit 300 that supports a data circuit for a low swing data bus in accordance with examples as disclosed herein. Circuit 300 may be an example of a FIFO cell 265 (e.g., FIFO cell 265-a) as described with reference to FIG. 2. Circuit 300 may include an input 310 (e.g., input 275 as described with reference to FIG. 2). In some examples, input 310 may include a transistor 315. Circuit 300 may include precharge components 320-a and 320-b (e.g., precharge components 270 as described with reference to FIG. 2). Circuit 300 may include logic 330-a and output 340 (e.g., output 285 as described with reference to FIG. 2). In some examples, circuit 300 may receive data 305 from one or more locations of a memory array (e.g., memory array 200 as described with reference to FIG. 2) or a memory device (e.g., memory device 110 as described with reference to FIG. 1). The circuit 300 may be coupled with a high-frequency bus (e.g., data bus 280 or data bus 290 as described with reference to FIG. 2). In some examples, the bus may be a limited swing bus as described with reference to FIGS. 1 and 2.

Input 310 may be configured to receive data 305. In some examples, input 310 may receive data from a data bus (e.g., data bus 280 as described with reference to FIG. 1) coupled with the input 310. In some examples, the data bus may be operating a low swing voltage (e.g., at a first voltage lower than a second voltage associated with one or more components of a memory array (e.g., a full swing voltage)). For example, the data bus may use a limited swing voltage when transferring data associated with a logic state (e.g., value) '1'. In other examples, the data bus may be configured to transfer the data at a third voltage when the data is associated with a logic state '0' (e.g., a VSS voltage at or near a ground voltage). In some examples, the input 310 may be configured to receive the first voltage (e.g., the limited voltage) or the third voltage (e.g., a voltage at or near ground). In some examples, input 310 may include an nMOS transistor 315, among other options or combinations of components. In such examples, the nMOS transistor 315 may be configured to pull down a voltage associated with the data 305—e.g., the nMOS transistor 315 may not send a pull-up voltage (e.g., a full swing voltage). In some examples, the nMOS transistor 315 may output a voltage that is a difference between the input voltage and a threshold voltage of the nMOS transistor 315. As described with reference to FIG. 2, there may be an input 310 for each FIFO cell (e.g., for each FIFO cell 265). For example, one or more (e.g., several) additional parallel inputs 310 of other FIFO cells may be in parallel to the input 310 of circuit 300 as illustrated in FIG. 2. In such examples, each input 310 may be coupled with a different input signal—e.g., a different input signal as described with reference to FIG. 2. For example, the input 310 of circuit 300 may be coupled to a first input signal (input 0), an input 310 of a second FIFO cell may be coupled with a second input (input 1), and a third input 310 of a third FIFO cell may be coupled with a third input (input 2). To select a respective input 310, the circuit 300 may use an input pointer 350. For example, each nMOS transistor 315 gate may be coupled to an input pointer 350 configured to receive the respective input signal and the circuit 300 may apply a voltage to the input pointer 350 to activate a respective input 310 based on the FIFO cell selected—e.g., activate the input 310 when receiving the first input signal at input pointer 350 as illustrated in FIG. 3 based on selecting circuit 300 (e.g., FIFO cell 265-a).

Precharge components 320-a and 320-b may be configured to precharge the circuit 300 to the second voltage (e.g., the full swing voltage) based on receiving a signal 325. In some examples, the circuit 300 may be configured to process data associated with a respective logic state (e.g., a logic state '1') at the second voltage. In such examples, the circuit 300 may be configured to recover from the first voltage to the second voltage to process the data. Accordingly, the circuit 300 may receive a signal 325 (e.g., a precharge signal) at one or more precharge components (e.g., precharge components 320-a and 320-b). In some examples, the circuit 300 may receive the signal 325 before receiving the data 305—e.g., the circuit 300 may precharge to the second voltage before receiving the data 305. In one example, precharge component 320-a may be a p-channel metal-oxide semiconductor (e.g., a pMOS) transistor. In such examples, precharge component 320-a may have a source coupled with an output of the input 310 and a drain coupled with a logic 330-b. The gate of the precharge component 320-a may also receive the precharge signal 325. In one example, precharge component 320-b may be a nMOS transistor. In such examples, the precharge component 320-b may have a source coupled with logic 330-b and a drain coupled with a ground voltage (e.g., VSS). The gate of the precharge component 320-b may receive the precharge signal 325. In other examples, the precharge component 320-a or precharge component 320-b may be a different type of transistor (e.g., p-type or n-type transistor) or other components and coupled at a different locations—e.g., the precharge components 320 may be any components that drives the circuit 300 to the second voltage.

Logic 330-a and logic 330-b may be configured to store data 305, process data 305, or otherwise perform digital calculations on data 305. Output signals 345-a and 345-b are used to output data from the circuit 300 (e.g., FIFO cell 265-a) on a controlled timing without an delay differences—e.g., a new timing different than the input timing. In such examples, the circuit 300 may store the data at logic 330-a or logic 330-b until the data is transferred to the output 340. In some examples, logic 330-a and logic 330-b may process data 305 associated with the logic state '1' at the second voltage and process data 305 associated with a logic state '0' at the third voltage—e.g., the logic 330-a or logic 330-b may store data associated with a logic state '0' at a voltage at or near ground (e.g., VSS). That is, the circuit 300 may discharge the second voltage to the third voltage based on receiving data associated with the logic state '0' as described with reference to FIG. 4.

Output 340 may be configured to output the data 305. In some examples, there may be multiple outputs 340 in parallel to the circuit 300 as described with reference to FIG. 2—e.g., multiple outputs 340 for parallel FIFO cells 265. To select a respective output 340, the circuit 300 may use an output pointer 345-a and 345-b. For example, the circuit 300 may apply a voltage to the output pointer 345-a and output pointer 345-b to activate a respective output 340 based on the FIFO cell selected—e.g., activate the output 340 illustrated in FIG. 3 based on selecting a first FIFO cell (e.g., FIFO cell 265-a).

In some examples, the circuit 300 may include a pMOS transistor 315 at the input 310 rather instead of the nMOS transistor. In such examples, the system may transfer data 305 over the data bus at a limited swing to a full swing—e.g., the data bus may transfer data 305 associated with a logic '0' at the limited swing voltage and data 305 associated with logic '1' at the full swing. In such examples, the bus may conserve power by reducing the current consumption to go from the half swing to the full swing compared with going from no swing (e.g., ground) to full swing. Accordingly, the input 310 may receive the second voltage (e.g., voltage associated with transferring logic state '0'). The pMOS transistor 315 may pull up the second voltage instead of pull-down as described with reference to the nMOS transistor 315. Additionally, when the circuit 300 utilizes the pMOS transistor 315, the precharge components 320 may instead be discharge components. That is, the circuit 300 may process the data 305 at a voltage (e.g., the third voltage) lower than the voltage associated with the data 305 (e.g., the second voltage). Accordingly, the circuit 300 may discharge from second voltage to the third voltage to process and/or store data 305 associated with a logic '0'.

By utilizing the input 310 and the precharge components 320, the circuit 300 may be able to recover from a limited swing to the full swing to process the data (e.g., from the first voltage to the second voltage) without additional complicated CMOS circuitry. In such examples, a system (e.g., system 100) may conserve power and concurrent by transferring data over data busses at limited swing signaling and recovering to full swing to process and handle the data 305. That is, the nMOS transistor 315 may prevent the circuit 300 voltage (e.g., the FIFO voltage) from leaking back to the data bus, enabling the system to transfer over the data bus at a limited swing voltage and recover the full swing voltage at the circuit 300 to process the data.

Figure 4:
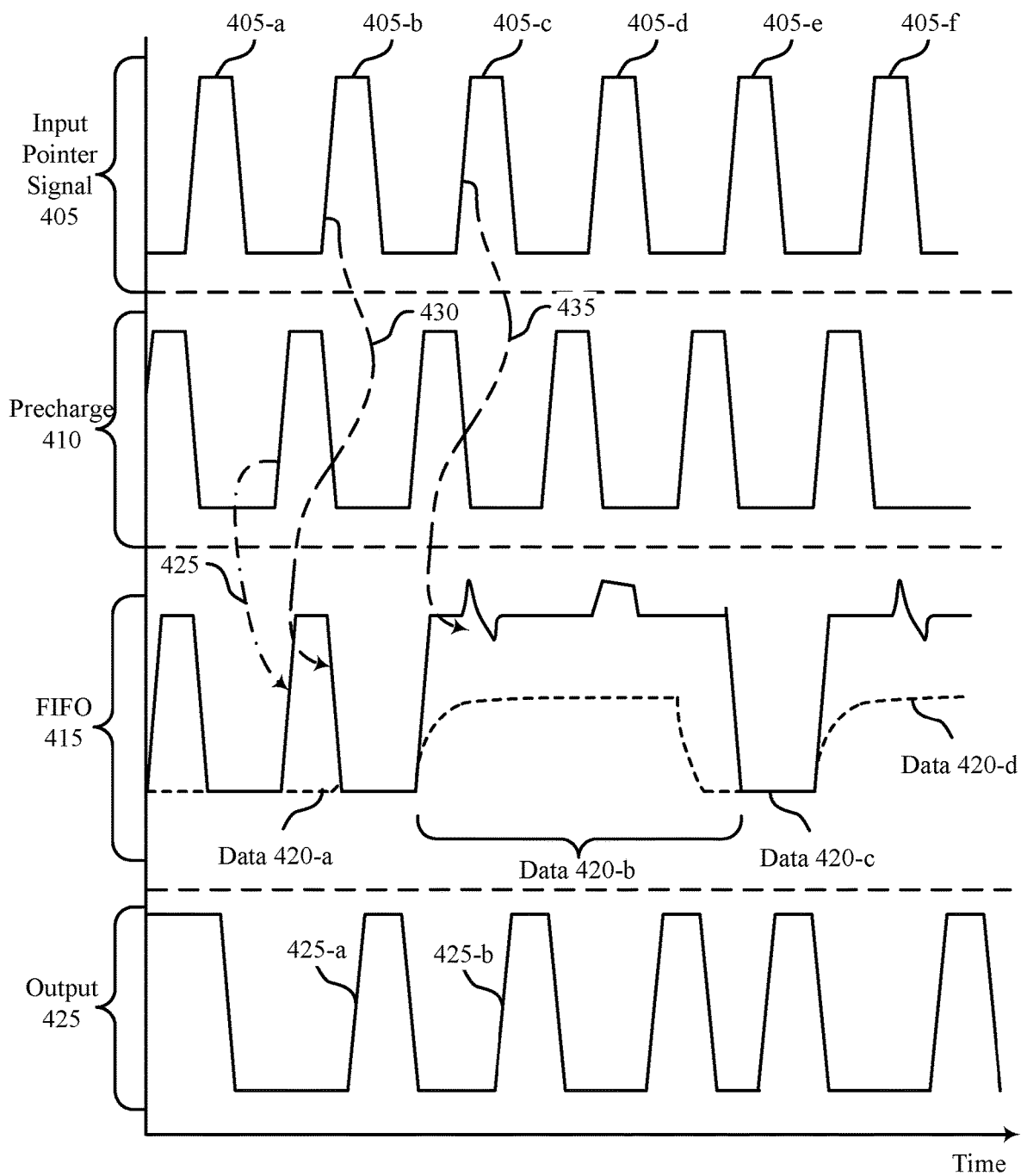
FIG. 4 illustrates an example of a timing diagram that supports a data circuit for a low swing data bus in accordance with examples as disclosed herein.

FIG. 4 illustrates an example of a timing diagram 400 that supports a data circuit for a low swing data bus in accordance with examples as disclosed herein. For example, the timing diagram 400 may illustrate operations performed by circuit 300 and the components of the circuit 300 as described with reference to FIG. 3 over time. The timing diagram 400 illustrates examples of a circuit 300 receiving input pointer signals 405 (e.g., input signals at input pointer 350 as described with reference to FIG. 3), receiving data 420 (e.g., data 305 as described with reference to FIG. 3) and receiving output signals 425 (e.g., output signals 345 as described with reference to FIG. 3). The timing diagram 400 may also show the circuit 300 receiving a precharge signal 410 (e.g., precharge signal 325 as described with reference to FIG. 3). The timing diagram 400 may also illustrate a voltage of FIFO 415 (e.g., circuit 300) voltage compared with the received data 420.

In some examples, the circuit 300 may receive input pointer signals 405 as illustrated in FIG. 4. As described with reference to FIG. 3, a respective FIFO cell (e.g., FIFO cell 265-a as described with reference to FIG. 2) may be selected to receive data based on the input pointer signal 405 being in a high state. For example, circuit 300 may be selected when the input pointer signal 405-a is received at a gate of an nMOS transistor of an input of the FIFO cell—e.g., nMOS transistor 315 of the input 310 as described with reference to FIG. 3.

In some examples, the circuit 300 may receive a precharge signal 410 before receiving a respective input pointer signal 405. That is, as described with reference to FIG. 3, circuit 300 may receive data associated with a logic state '1' from the data bus at a limited swing voltage (e.g., the bus level 420-b voltage). In such examples, the circuit 300 may need to recover from the limited swing to a full swing voltage (e.g., a voltage associated with processing data associated with a logic state '1' at the FIFO circuit). That is, the circuit 300 may utilize the precharge to compensate for the data bus using the limited swing voltage.

For example, the circuit 300 may receive a precharge signal 410 at a time 425—e.g., at a time before receiving input pointer signal 405-b. The precharge signal 410 may activate one or more precharge components (e.g., precharge components 320 as described with reference to FIG. 3) and drive a voltage of the circuit 300 to a first voltage (e.g., the FIFO 415 voltage may go from ground to the full swing voltage). After the precharge, the circuit 300 may receive the input pointer signal 405-b. In some examples, after receiving the input pointer signal 405-b, the circuit 300 may receive data 420-a. In some examples, data 420-a may be associated with a logic state '0.' That is, the data bus (e.g., data bus 280) may transmit data 420-a at a voltage (e.g., a second voltage) that is at or near a ground voltage. In such examples, the circuit 300 may discharge and adjust the first voltage to the second voltage (e.g., the ground voltage, VSS). The circuit 300 may process the data 420-a at the second voltage and receive an output 425-a and output data 420-a from the circuit 300—e.g., the circuit 300 may read a first logic state '0' based at least in part on precharging and discharging the FIFO circuit.

Before receiving an input pointer signal 405-c and after receiving the output signal 425-a, the circuit 300 may receive a second precharge signal 410. In some examples, in response to the second precharge signal 410, circuit 300 may activate the one or more components and drive the circuit 300 to the first voltage. After the precharge, circuit 300 may receive the input pointer signal 405-c based on the circuit 300 being selected to receive data. In some examples, the circuit 300 may receive data 420-*b* after receiving the input pointer signal 405-*c*. For example, the circuit 300 may receive data 420-*b* associated with a logic state '1.' That is, the data bus may transmit data 420-*b* at a third voltage (e.g., a limited swing voltage) associated with transferring data associated with a logic '1.' In such examples, the circuit 300 may maintain the first voltage—e.g., the FIFO 415 voltage may remain high at the first voltage. As described with reference to FIG. 3, the circuit 300 may avoid current leakage of the first voltage to the data bus 280 based on an nMOS transistor (e.g., nMOS transistor 315 as described with reference to FIG. 3) at the input (e.g., input 310) of the circuit 300. In some examples, the circuit 300 may maintain the first voltage to store the data 420-*b*. The circuit 300 may process the data 420-*b* at the first voltage and receive an output signal 425-*b*—e.g., the circuit 300 may read a first logic state '1' based at least in part on precharging and maintaining the first voltage at the FIFO circuit and output the data 420-*b* based on receiving the output signal 425-*b*.

In some examples, the timing diagram 400 may illustrate additional voltages of the bus and circuit 300 based on receiving additional input pointer signals 405. For example, the circuit may receive a precharge signal 410 before receiving input pointer signal 405-*d*. In some examples, circuit 300 may already be at the first voltage—e.g., based on receiving and processing data 420-*b*. In such examples, the FIFO 415 may remain at the first voltage based on receiving the precharge signal 410. The data 420-*b* may be associated with the logic state '1' based on the bus remaining at the third voltage. Circuit 300 may discharge based on receiving data 420-*c* after receiving input signal pointer 405-*e*—e.g., data 420-*c* received after input pointer signal 405-*e* may be associated with a logic state '0' based on the data bus transmitting the second voltage (e.g., ground voltage). The circuit 300 may then receive another precharge signal 410, precharge the circuit 300 to the first voltage (e.g., FIFO 415 may go high) and refrain from discharging based on data 420-*d* being associated with a logic state '1' after receiving input pointer signal 405-*f*—e.g., the data bus may transmit the third voltage. By precharging the FIFO circuit each time before receiving data, the memory device may utilize a limited swing voltage on a data bus and recover the limited swing voltage to the full swing at the FIFO circuit to process the data—e.g., by discharging or maintaining the precharge voltage after receiving the data 420.

Figure 5:
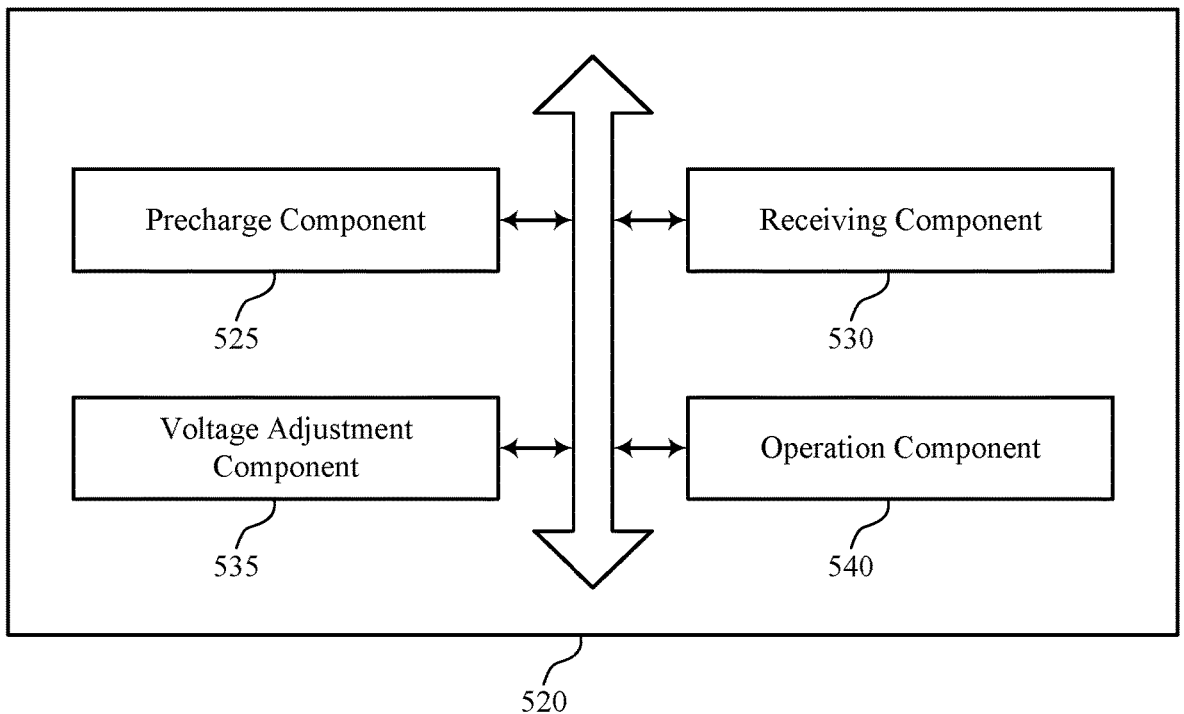
FIG. 5 shows a block diagram of a memory device that supports a data circuit for a low swing data bus in accordance with examples as disclosed herein.

FIG. 5 shows a block diagram 500 of a memory device 520 that supports a data circuit for a low swing data bus in accordance with examples as disclosed herein. The memory device 520 may be an example of aspects of a memory device as described with reference to FIGS. 1 through 4. The memory device 520, or various components thereof, may be an example of means for performing various aspects of a data circuit for a low swing data bus as described herein. For example, the memory device 520 may include a precharge component 525, a receiving component 530, a voltage adjustment component 535, an operation component 540, or any combination thereof. Each of these components may communicate, directly or indirectly, with one another (e.g., via one or more buses).

The precharge component 525 may be configured as or otherwise support a means for precharging a first in first out (FIFO) circuit to a first voltage at. In some cases, the precharge component 525 may be configured as or otherwise support a means for precharging the FIFO to the first voltage after adjusting the FIFO circuit to the second voltage. In some cases, the precharge component 525 may be configured as or otherwise support a means for receiving a precharge signal, where precharging the FIFO circuit is based at least in part on receiving the precharge signal. In some examples, the precharge component 525 may be configured as or otherwise support a means for activating a first transistor coupled with an input of the FIFO to precharge the FIFO to the first voltage based at least in part on receiving the precharge signal.

The receiving component 530 may be configured as or otherwise support a means for receiving, at the FIFO, a second voltage associated with one or more components of a memory array and with transferring a first logic state of a memory cell in the memory array over a data bus based at least in part on precharging the FIFO to the first voltage. In some examples, the receiving component 530 may be configured as or otherwise support a means for receiving, at the FIFO, a third voltage associated with one or more components of the memory array and with transferring a second logic state of the memory cell over the data bus, where the third voltage is less than a voltage associated with the second logic state. In some instances, the receiving component 530 may be configured as or otherwise support a means for receiving a voltage of the first logic state is the second voltage.

The voltage adjustment component 535 may be configured as or otherwise support a means for adjusting the FIFO circuit to the second voltage based at least in part on receiving the second voltage. In some instances, the voltage adjustment component 535 may be configured as or otherwise support a means for maintaining the first voltage at the FIFO based at least in part on receiving the third voltage associated with transferring the second logic state of the memory cell, where maintaining the first voltage is associated with storing the second logic state of the memory cell.

In some cases, the operation component 540 may be configured as or otherwise support a means for reading the first logic state received based at least in part on precharging the FIFO. In some examples, the operation component 540 may be configured as or otherwise support a means for reading the second logic state received based at least in part on precharging the FIFO.

Figure 6:
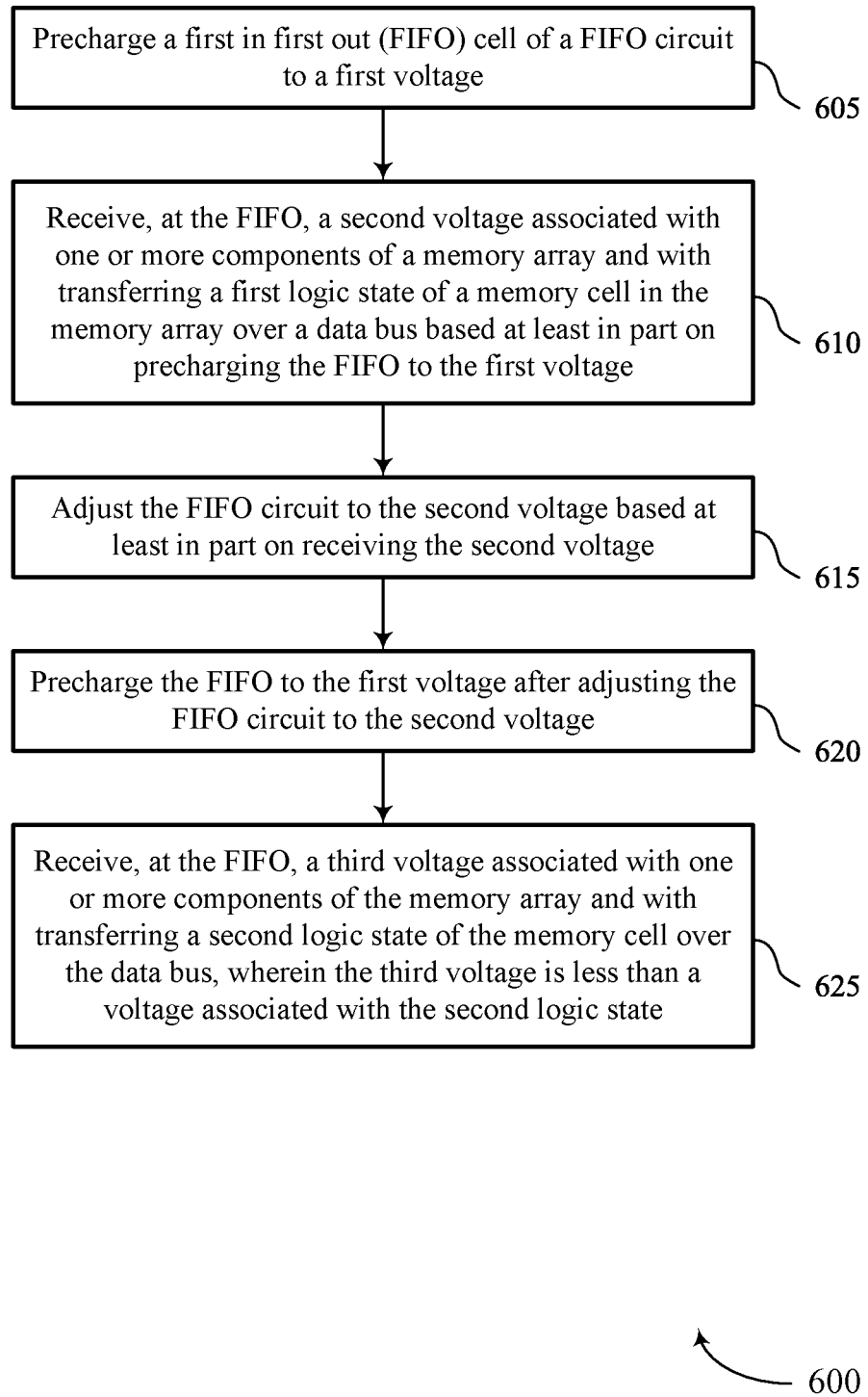
FIG. 6 shows a flowchart illustrating a method or methods that support a data circuit for a low swing data bus in accordance with examples as disclosed herein.

FIG. 6 shows a flowchart illustrating a method 600 that supports a data circuit for a low swing data bus in accordance with examples as disclosed herein. The operations of method 600 may be implemented by a memory device or its components as described herein. For example, the operations of method 600 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 605, the method may include precharging a first in first out (FIFO) cell of a FIFO circuit to a first voltage. That is, the method may include precharging a FIFO cell (e.g., FIFO cell 265-*a*) of a FIFO circuit to the first voltage. The operations of 605 may be performed in accordance with examples as disclosed herein. In some examples, aspects of the operations of 605 may be performed by a precharge component 525 as described with reference to FIG. 5.

At 610, the method may include receiving, at the FIFO, a second voltage associated with one or more components of a memory array and with transferring a first logic state of a memory cell in the memory array over a data bus based at least in part on precharging the FIFO to the first voltage. The operations of 610 may be performed in accordance with examples as disclosed herein. In some examples, aspects of the operations of 610 may be performed by a receiving component 530 as described with reference to FIG. 5.

At 615, the method may include adjusting the FIFO circuit to the second voltage based at least in part on receiving the second voltage. The operations of 615 may be performed in accordance with examples as disclosed herein. In some examples, aspects of the operations of 615 may be performed by a voltage adjustment component 535 as described with reference to FIG. 5.

At 620, the method may include precharging the FIFO to the first voltage after adjusting the FIFO circuit to the second voltage. The operations of 620 may be performed in accordance with examples as disclosed herein. In some examples, aspects of the operations of 620 may be performed by a precharge component 525 as described with reference to FIG. 5.

At 625, the method may include receiving, at the FIFO, a third voltage associated with one or more components of the memory array and with transferring a second logic state of the memory cell over the data bus, where the third voltage is less than a voltage associated with the second logic state. The operations of 625 may be performed in accordance with examples as disclosed herein. In some examples, aspects of the operations of 625 may be performed by a receiving component 530 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor) for precharging a first in first out (FIFO) circuit to a first voltage at, receiving, at the FIFO, a second voltage associated with one or more components of a memory array and with transferring a first logic state of a memory cell in the memory array over a data bus based at least in part on precharging the FIFO to the first voltage, adjusting the FIFO circuit to the second voltage based at least in part on receiving the second voltage, precharging the FIFO to the first voltage after adjusting the FIFO circuit to the second voltage, and receiving, at the FIFO, a third voltage associated with one or more components of the memory array and with transferring a second logic state of the memory cell over the data bus, where the third voltage is less than a voltage associated with the second logic state.

Some examples of the method 600 and the apparatus described herein may further include operations, features, circuitry, logic, means, or instructions for maintaining the first voltage at the FIFO based at least in part on receiving the third voltage associated with transferring the second logic state of the memory cell, where maintaining the first voltage may be associated with storing the second logic state of the memory cell.

Some cases of the method 600 and the apparatus described herein may further include operations, features, circuitry, logic, means, or instructions for receiving a precharge signal, where precharging the FIFO circuit may be based at least in part on receiving the precharge signal.

Some instances of the method 600 and the apparatus described herein may further include operations, features, circuitry, logic, means, or instructions for activating a first transistor coupled with an input of the FIFO to precharge the FIFO to the first voltage based at least in part on receiving the precharge signal.

Some cases of the method 600 and the apparatus described herein may further include operations, features, circuitry, logic, means, or instructions for reading the first logic state received based at least in part on precharging the FIFO and reading the second logic state received based at least in part on precharging the FIFO.

In some instances of the method 600 and the apparatus described herein, a voltage of the first logic state may be the second voltage.

It should be noted that the methods described herein describe possible implementations, and that the operations and the steps may be rearranged or otherwise modified and that other implementations are possible. Further, portions from two or more of the methods may be combined.

An apparatus is described. The apparatus may include a data bus configured to transfer data at a first voltage different than a second voltage that is associated with one or more components of the memory array, a transistor coupled with the data bus and configured to receive the first voltage from the data bus and to send a third voltage, and a first in first out (FIFO) circuit coupled with the transistor and configured to receive the third voltage from the transistor, the FIFO circuit including one or more precharge components configured to drive an input voltage of the FIFO circuit to the second voltage associated with the one or more components of the memory array based at least in part on receiving the third voltage.

In some cases, the apparatus may include adjust the second voltage to a fourth voltage associated with a ground based at least in part on driving the input voltage to the second voltage.

In some instances, the apparatus may include receive a precharge signal and drive the input voltage of the FIFO circuit to the second voltage based at least in part on receiving the precharge signal.

In some examples, the apparatus may include maintain the second voltage associated with the logic state of the memory cell based at least in part on storing the logic state at the FIFO circuit.

In some cases of the apparatus, the one or more precharge components include a second transistor coupled with the transistor and a first voltage source, the second transistor configured to drive the input voltage of the FIFO circuit based at least in part on receiving the third voltage from the transistor and a third transistor coupled with the first voltage source.

In some instances of the apparatus, the transistor may be an nMOS transistor and the first voltage may be less than the second voltage.

In some cases of the apparatus, the third voltage may be a difference between the first voltage and a threshold voltage of the nMOS transistor.

In some examples of the apparatus, the transistor in a pMOS transistor and the first voltage may be greater than the second voltage.

In some instances, the apparatus may include reduce the third voltage to the second voltage.

In some cases of the apparatus, the second voltage associated with the one or more components of the memory array may be associated with a logic state of a memory cell of the memory array.

Another apparatus is described. The apparatus may include a data bus configured to transfer data at a first voltage different than a second voltage associated with one or more components of the memory array, an nMOS transistor configured to receive the first voltage over the data bus and pull down the first voltage to a third voltage, and a first in first out (FIFO) circuit coupled with the nMOS transistor and configured to receive the third voltage from the nMOS transistor, the FIFO including one or more precharge components configured to drive an input voltage of the FIFO to the second voltage associated with the one or more components of the memory array at least in part on receiving the third voltage.

In some examples, the apparatus may include adjust the second voltage to a fourth voltage associated with a ground based at least in part on driving the input voltage to the second voltage.

In some instances of the apparatus, the data bus may be further configured to transfer second data at a fourth voltage associated with the one or more components of the memory array, the nMOS transistor may be configured to receive the fourth voltage over the data bus and send the fourth voltage, and the FIFO circuit may be configured to adjust the second voltage to the fourth voltage based at least in part on receiving the fourth voltage.

In some cases of the apparatus, the one or more precharge components further include a second transistor coupled with the nMOS transistor and a first voltage source, the second transistor configured to drive the input voltage of the FIFO circuit based at least in part on receiving the third voltage from the nMOS transistor and a third transistor coupled with the first voltage source.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a data bus configured to transfer data at a first voltage different than a second voltage that is associated with one or more components of a memory array, the first voltage based at least in part on a logic state of a memory cell of the memory array;
    a transistor coupled with the data bus and configured to receive the data at the first voltage from the data bus and to send the data at a third voltage; and
    a first in first out (FIFO) circuit coupled with the transistor and comprising one or more precharge components, the FIFO circuit configured to:
        receive the data at the third voltage from the transistor;
        drive, using the one or more precharge components, an input voltage of the FIFO circuit to the second voltage associated with the one or more components of the memory array based at least in part on receiving the data at the third voltage; and
        process, based at least in part on the logic state of the memory cell and driving the input voltage of the FIFO circuit to the second voltage, the data at the second voltage or a fourth voltage different than the second voltage.

2. The apparatus of claim 1, wherein the FIFO circuit is further configured to:
    adjust the second voltage to the fourth voltage based at least in part on driving the input voltage to the second voltage, wherein the fourth voltage is associated with a ground.

3. The apparatus of claim 1, wherein the FIFO circuit is further configured to:
    receive a precharge signal; and
    drive the input voltage of the FIFO circuit to the second voltage based at least in part on receiving the precharge signal.

4. The apparatus of claim 1, wherein the one or more precharge components comprise:
    a second transistor coupled with the transistor and a first voltage source, the second transistor configured to drive the input voltage of the FIFO circuit based at least in part on receiving the data at the third voltage from the transistor; and
    a third transistor coupled with the first voltage source.

5. The apparatus of claim 1, wherein the transistor is an nMOS transistor and the first voltage is less than the second voltage.

6. The apparatus of claim 5, wherein the third voltage is a difference between the first voltage and a threshold voltage of the nMOS transistor.

7. The apparatus of claim 1, wherein the transistor in a pMOS transistor and the first voltage is greater than the second voltage.

8. The apparatus of claim 7, wherein, to drive the input voltage of the FIFO circuit, the one or more precharge components are configured to:
reduce the third voltage to the second voltage.

9. The apparatus of claim 1, wherein the second voltage associated with the one or more components of the memory array is associated with a logic state of a memory cell of the memory array.

10. An apparatus, comprising:
a data bus configured to transfer data at a first voltage different than a second voltage that is associated with one or more components of a memory array;
a transistor coupled with the data bus and configured to receive the first voltage from the data bus and to send a third voltage; and
a first in first out (FIFO) circuit coupled with the transistor and comprising one or more precharge components, the FIFO circuit configured to:
receive the third voltage from the transistor;
drive, using the one or more precharge components, an input voltage of the FIFO circuit to the second voltage associated with the one or more components of the memory array based at least in part on receiving the third voltage; and
maintain the second voltage associated with a logic state of a memory cell of the memory array based at least in part on storing the logic state at the FIFO circuit.

11. A method, comprising:
precharging a first in first out (FIFO) circuit to a first voltage;
receiving, at the FIFO circuit, a second voltage associated with one or more components of a memory array and with transferring a first logic state of a memory cell in the memory array over a data bus based at least in part on precharging the FIFO circuit to the first voltage;
adjusting the FIFO circuit to the second voltage based at least in part on receiving the second voltage;
precharging the FIFO circuit to the first voltage after adjusting the FIFO circuit to the second voltage; and
receiving, at the FIFO circuit, a third voltage associated with one or more components of the memory array and with transferring a second logic state of the memory cell over the data bus, wherein the third voltage is less than a voltage associated with the second logic state.

12. The method of claim 11, further comprising:
maintaining the first voltage at the FIFO circuit based at least in part on receiving the third voltage associated with transferring the second logic state of the memory cell, wherein maintaining the first voltage is associated with storing the second logic state of the memory cell.

13. The method of claim 11, further comprising:
receiving a precharge signal, wherein precharging the FIFO circuit is based at least in part on receiving the precharge signal.

14. The method of claim 13, further comprising:
activating a first transistor coupled with an input of the FIFO circuit to precharge the FIFO circuit to the first voltage based at least in part on receiving the precharge signal.

15. The method of claim 11, further comprising:
reading the first logic state received based at least in part on precharging the FIFO circuit; and
reading the second logic state received based at least in part on precharging the FIFO circuit.

16. The method of claim 11, wherein a voltage of the first logic state is the second voltage.

17. An apparatus, comprising:
a data bus configured to transfer data at a first voltage different than a second voltage associated with one or more components of a memory array, the first voltage based at least in part on a logic state of a memory cell of the memory array;
an nMOS transistor configured to receive the data at the first voltage over the data bus and pull down the first voltage to a third voltage; and
a first in first out (FIFO) circuit coupled with the nMOS transistor and comprising one or more precharge components, the FIFO circuit configured to:
receive the data at the third voltage from the nMOS transistor;
drive an input voltage of the FIFO circuit to the second voltage associated with the one or more components of the memory array based at least in part on receiving the data at the third voltage; and
process, based at least in part on the logic state of the memory cell, the data at the second voltage or a fourth voltage associated with ground.

18. The apparatus of claim 17, wherein the FIFO circuit is further configured to:
adjust the second voltage to the fourth voltage associated with the ground based at least in part on driving the input voltage to the second voltage.

19. The apparatus of claim 17, wherein the one or more precharge components further comprise:
a second transistor coupled with the nMOS transistor and a first voltage source, the second transistor configured to drive the input voltage of the FIFO circuit based at least in part on receiving the data at the third voltage from the nMOS transistor; and
a third transistor coupled with the first voltage source.

20. An apparatus, comprising:
a data bus configured to transfer data at a first voltage different than a second voltage associated with one or more components of a memory array;
an nMOS transistor configured to receive the first voltage over the data bus and pull down the first voltage to a third voltage; and
a first in first out (FIFO) circuit coupled with the nMOS transistor and configured to receive the third voltage from the nMOS transistor, the FIFO circuit comprising one or more precharge components configured to drive an input voltage of the FIFO circuit to the second voltage associated with the one or more components of the memory array based at least in part on receiving the third voltage, wherein:
the data bus is further configured to transfer second data at a fourth voltage associated with the one or more components of the memory array;
the nMOS transistor is configured to receive the fourth voltage over the data bus and send the fourth voltage; and
the FIFO circuit is configured to adjust the second voltage to the fourth voltage based at least in part on receiving the fourth voltage.

* * * * *